(12) United States Patent
Mouchet

(10) Patent No.: US 9,817,037 B2
(45) Date of Patent: *Nov. 14, 2017

(54) ELECTRICAL CURRENT TRANSDUCER WITH WOUND MAGNETIC CORE

(71) Applicant: LEM INTELLECTUAL PROPERTY SA, Fribourg (CH)

(72) Inventor: Steve Mouchet, Pringy (FR)

(73) Assignee: LEM INTELLECTUAL PROPERTY SA, Fribourg (CH)

( * ) Notice: Subject to any disclaimer, the term of this patent is extended or adjusted under 35 U.S.C. 154(b) by 75 days.

This patent is subject to a terminal disclaimer.

(21) Appl. No.: 14/649,906

(22) PCT Filed: Dec. 4, 2013

(86) PCT No.: PCT/IB2013/060641
§ 371 (c)(1),
(2) Date: Jun. 4, 2015

(87) PCT Pub. No.: WO2014/087350
PCT Pub. Date: Jun. 12, 2014

(65) Prior Publication Data
US 2016/0187387 A1    Jun. 30, 2016

(30) Foreign Application Priority Data

Dec. 7, 2012  (EP) .................................... 12196185

(51) Int. Cl.
*G01R 15/20*       (2006.01)
*H01F 38/30*       (2006.01)
(Continued)

(52) U.S. Cl.
CPC ....... *G01R 15/207* (2013.01); *G01R 19/0092* (2013.01); *H01F 38/30* (2013.01); *H01F 41/0213* (2013.01)

(58) Field of Classification Search
None
See application file for complete search history.

(56) References Cited

U.S. PATENT DOCUMENTS

| 5,552,700 A | 9/1996 | Tanabe et al. |
| 2005/0237049 A1 | 10/2005 | Ozaki et al. |
| 2016/0187387 A1* | 6/2016 | Mouchet ................. H01F 38/30 324/126 |

FOREIGN PATENT DOCUMENTS

| JP | H08241821 A | 9/1996 |
| JP | 2008224260 A | 9/2008 |

OTHER PUBLICATIONS

International Search Report and Written Opinion issued by the European Patent Office, dated Mar. 24, 2014, for International Application No. PCT/IB2013/060641; 9 pages.

* cited by examiner

*Primary Examiner* — Paresh Patel
(74) *Attorney, Agent, or Firm* — Faegre Baker Daniels LLP

(57) ABSTRACT

Electrical current transducer including a housing (5), a magnetic field detector device (3) comprising a magnetic field sensing element (11), and a magnetic circuit comprising a magnetic core (4) with a gap (6) and a bridging device (8) mounted on the magnetic core and spanning across the gap. The bridging device comprises a gap-width setting portion (26) made of a non-magnetic material inserted in the gap configured to determine a minimum width of the gap. The bridging device comprises at least two parts (8a, 8b), a first part mounted against a first lateral side (14a) of the magnetic core and a second part mounted (8b) mounted against a second lateral side (14b) of the magnetic core opposite the first lateral side, at least one of the first and second parts comprising fixing extensions (30) cooperating (Continued)

with the other of the first and second parts configured for clamping together the first and second parts around a portion of the magnetic core comprising the gap.

15 Claims, 4 Drawing Sheets

(51) Int. Cl.
*H01F 41/02* (2006.01)
*G01R 19/00* (2006.01)

ELECTRICAL CURRENT TRANSDUCER WITH WOUND MAGNETIC CORE

BACKGROUND

The present invention relates to an electrical current transducer comprising a magnetic circuit with a magnetic core having an air-gap. The present invention is in particular related to an electrical current transducer with a wound magnetic core.

Many conventional current transducers comprise a magnetic core made of material with a high magnetic permeability and a magnetic field sensor, such as a Hall effect sensor, positioned in a gap formed in the magnetic core. A primary conductor extending through a central passage of the magnetic circuit generates a magnetic field that is picked-up by the magnetic core. The magnetic field flows across the gap and the magnetic field detector positioned therein. Since the gap represents a zone of low magnetic permeability and thus has an important effect on the magnetic field lines, it is important to accurately control the width of the gap in order to ensure accurate and reliable measurement of the electrical current to be measured.

It is also important to reduce losses in the transducer, in particular losses due to the formation of eddy currents in the magnetic core and to avoid magnetic saturation along any section of the magnetic core. The use of stacked laminated sheets to reduce eddy currents is well-known. A known means of forming a stacked multilayer magnetic circuit is by winding a thin band or strip of magnetic material to form an annular wound core. It is known to provide wound cores with air gaps, whereby the manufacturing process consists of first winding an annular toroidal core, subsequently applying resin to the core to hold the concentric layers of strip material and subsequently machining a gap radially through a section of the winding. Once the resin has been applied, annealing of the material of the wound magnetic core is difficult or no longer possible in view of the high temperatures required for the annealing process.

Working of materials with high magnetic permeabilities can affect their magnetic properties, in particular by increasing hysteresis effects and thus adversely affecting the magnetic performance of the magnetic circuit.

The gap length of a magnetic circuit may vary due to thermal and mechanical forces. It is known to stabilize the size of the gap by means of an element fixed to the magnetic core. In JP 2 601 297 the air gap of an annular wound magnetic core is fixed by means of a T-shaped element having a portion partially inserted in the air gap from the outer radial side of the magnetic circuit, the insert being held in place by means of a band wound around the magnetic circuit and the insert. A drawback of this design is that the insert partially engages in the air gap and thus limits the space for insertion of a magnetic field sensor. Moreover, the insert only engages the outer peripheral layers of the magnetic circuit and thus does not prevent variation of the size of the air gap of the inner radial layers of the magnetic circuit, in particular variations due to thermal forces that the resin binding the layers cannot entirely prevent. Also, heat treatment of the magnetic circuit after application of the resin is either not possible or at best limited. The position of the insert from the outer radial periphery of the magnetic circuit also increases the size of the magnetic circuit.

In EP2224461, a magnetic circuit with a wound core and a bridging element welded on a lateral side of the core and spanning across the air gap, is disclosed. This offers a compact configuration with stable fixing of the air gap. The welded connection between the bridging element and the magnetic core may however reduce the magnetic permeability of the magnetic core in the welding zone. Moreover, in particularly harsh environments, such as those found in automotive applications, the weld connections subjected to thermal and mechanical shock as well as a corrosive environment may deteriorate over time.

It is an object of this invention to provide an electrical current transducer having a magnetic circuit with gap, that is robust and economical to manufacture, especially in large series manufacturing, yet ensures accurate and reliable performance even when subjected to harsh operating environments.

It would be advantageous to provide an electrical current transducer having a magnetic core that has uniform magnetic material properties, in particular a high and uniform magnetic permeability.

SUMMARY

It is an object of this invention to provide a process for manufacturing a magnetic circuit for an electrical current transducer, that is economical and results in a magnetic core that performs accurately and reliably for current sensing applications, and that is robust and resistant to thermal and mechanical stresses.

It would be advantageous to provide a magnetic circuit with wound magnetic core that enables easy and versatile assembly of the various components of a current transducer.

Objects of this invention have been achieved by providing an electrical current transducer according to claim 1.

Disclosed herein is an electrical current transducer including a housing, a magnetic field detector device comprising a magnetic field sensing element, and a magnetic circuit comprising a magnetic core with a gap and a bridging device mounted on the magnetic core and spanning across the gap. The bridging device comprises a gap-width setting portion made of a non-magnetic material inserted in the gap configured to determine a minimum width of the gap. The bridging device comprises at least two parts, a first part mounted against a first lateral side of the magnetic core and a second part mounted against a second lateral side of the magnetic core opposite the first lateral side. At least one of the first and second parts comprise fixing extensions cooperating with the other of the first and second parts, the fixing extensions configured for clamping together the first and second parts against the opposed lateral sides, around a portion of the magnetic core comprising the gap.

The magnetic core may in particular be in the form of a wound magnetic core comprising a plurality of stacked concentric ring layers of magnetic material.

The bridging device may advantageously be adapted to provide an electrical grounding connection for the magnetic core.

The gap-width setting portion of the bridging device is preferably inserted within the gap from one of the lateral sides of the magnetic core and spanning between end faces of the magnetic core.

In an advantageous embodiment, the gap-width setting portion extends from a radially innermost layer to a radially outer layer of the magnetic core.

In an embodiment, the gap-width setting portion may advantageously be in a form of an essentially planar portion of non magnetic sheet material positioned essentially flush with the lateral outer side of the magnetic core.

The bridging device may advantageously further comprise housing fixing portions in the form of tabs or pins interfering with corresponding wall portions formed in a housing base part of the housing, the fixing portions configured to lock the magnetic circuit securely within the housing base part during assembly.

The bridging device first part and second part may each advantageously be a single piece non-magnetic die stamped metal sheet part. In an embodiment, the first part of the bridging device comprises a base portion from which the gap-width setting portion extends, the base portion being essentially planar, configured for lying against the first lateral side of the magnetic core.

The bridging device first part may comprises orifices in the base portion receiving therethrough free ends of fixing extensions of the second part, the free ends being crimped, for instance by a Y shaped deformation that is configured to bias the parts together to ensure a tight clamping force against the opposed lateral sides of the magnetic core.

In an advantageous embodiment, there are at least three fixing extensions, at least one radially inner fixing extension and at least two radially outer fixing extensions positioned against an outer radial side the annular core on either side of the air gap. The space between the radially outer fixing extensions is configured to enable insertion of the magnetic field detector in the gap.

A method of making a magnetic circuit of an electrical current transducer according to the invention includes the steps of:
  winding a magnetically permeable strip material to form a stacked multilayer ring core;
  machining a gap through a section of the stacked multilayer ring core;
  mounting the bridging device parts around the magnetic core such that the gap-width setting portion is inserted in gap and the fixing extensions of the second part are inserted through the corresponding cavities of the first part;
  crimping the ends of the fixing extensions such that the two parts are clamped together tightly against opposite lateral sides of the wound magnetic core.

After the assembly of the bridging device, the magnetic circuit is heat treated for annealing the magnetic material of the core.

BRIEF DESCRIPTION OF THE DRAWINGS

Further objects and advantageous features of the invention will be apparent from the claims and the following detailed description of an embodiment in conjunction with the annexed figures in which:

FIG. 2b is another view in perspective of the components of FIG. 2a;

FIG. 5 is a view of the housing base part shown in FIG. 4a.

DETAILED DESCRIPTION

Figure 1:
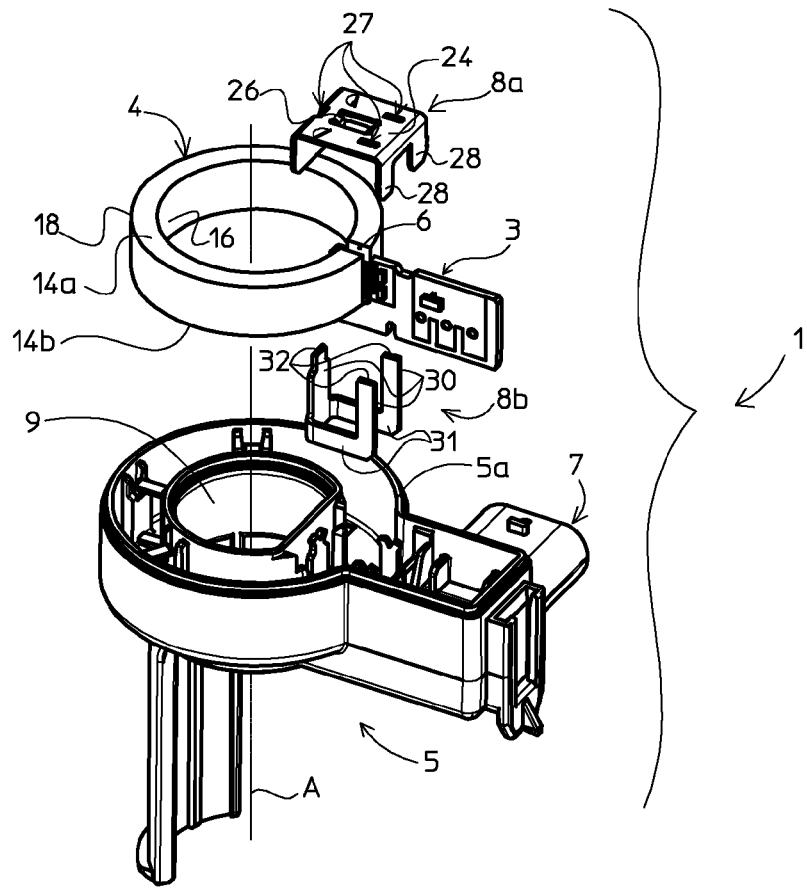
FIG. 1 is an exploded view in perspective of an electrical current transducer according to an embodiment of this invention.
Figure 2A:
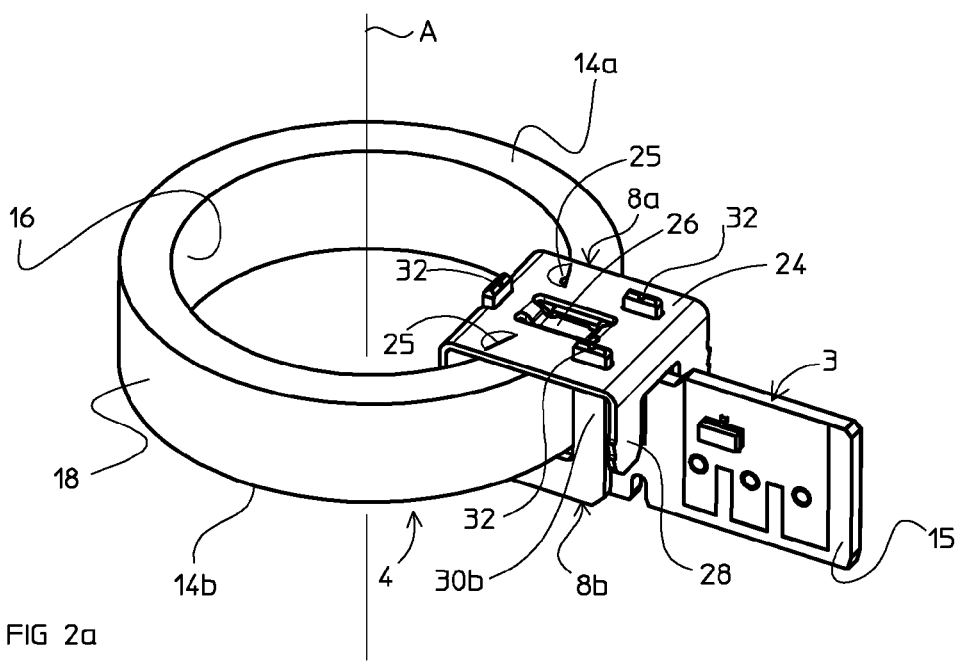
FIG. 2a is a view in perspective of a magnetic circuit and magnetic field detector of the current transducer shown in FIG. 1.
Figure 2B:
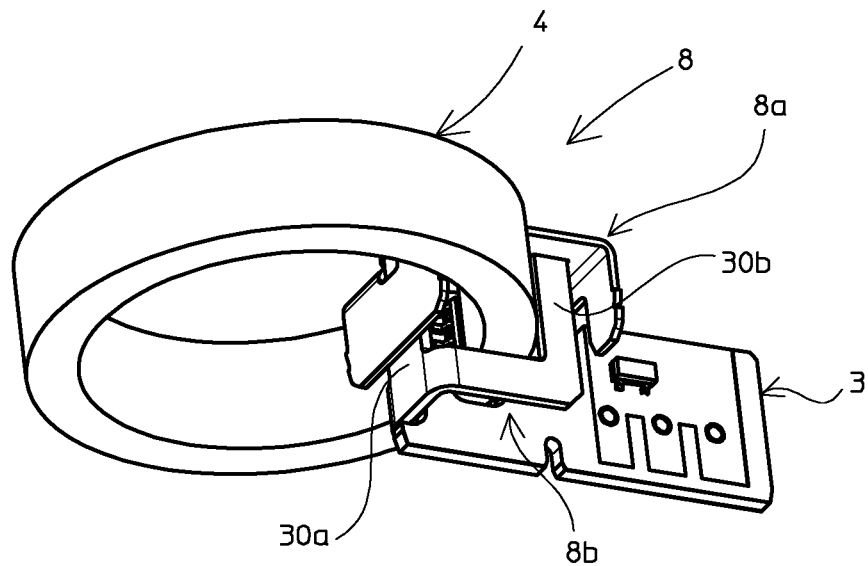
Figure 2C:
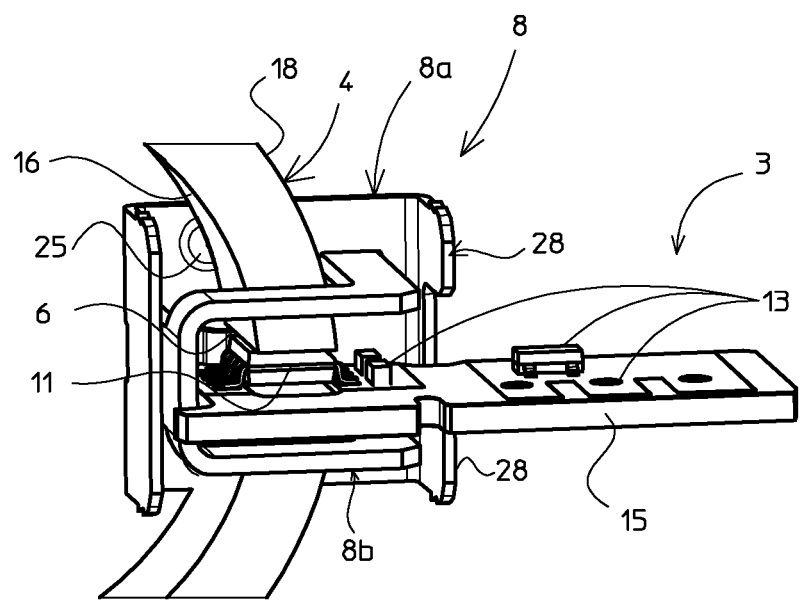
FIG. 2c is a view in perspective of part of the magnetic circuit with magnetic field detector.
Figure 3:
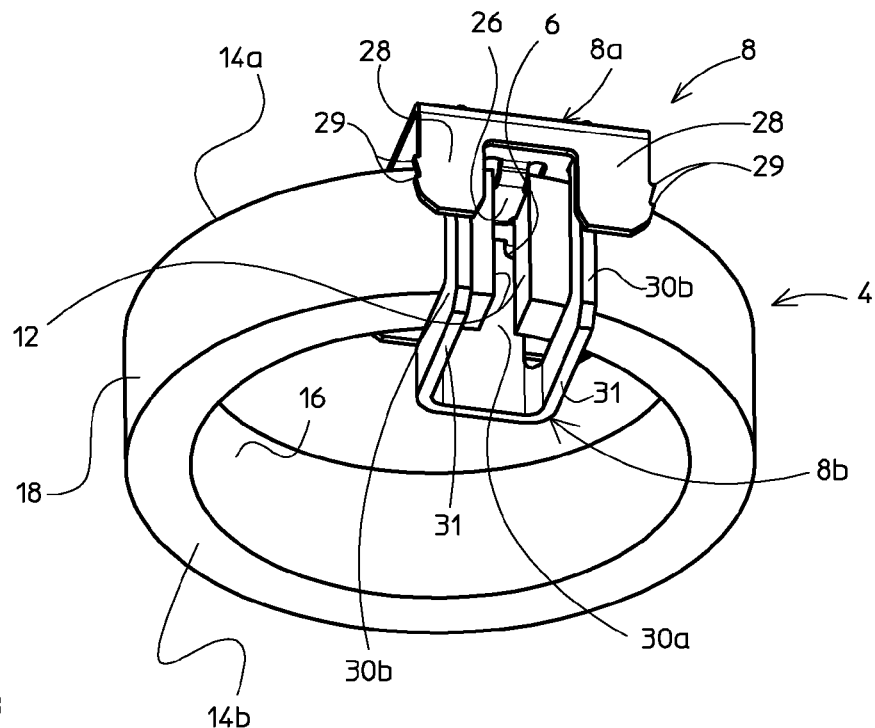
FIG. 3 is a view in perspective of an embodiment of the magnetic circuit without magnetic field detector.
Figure 4A:
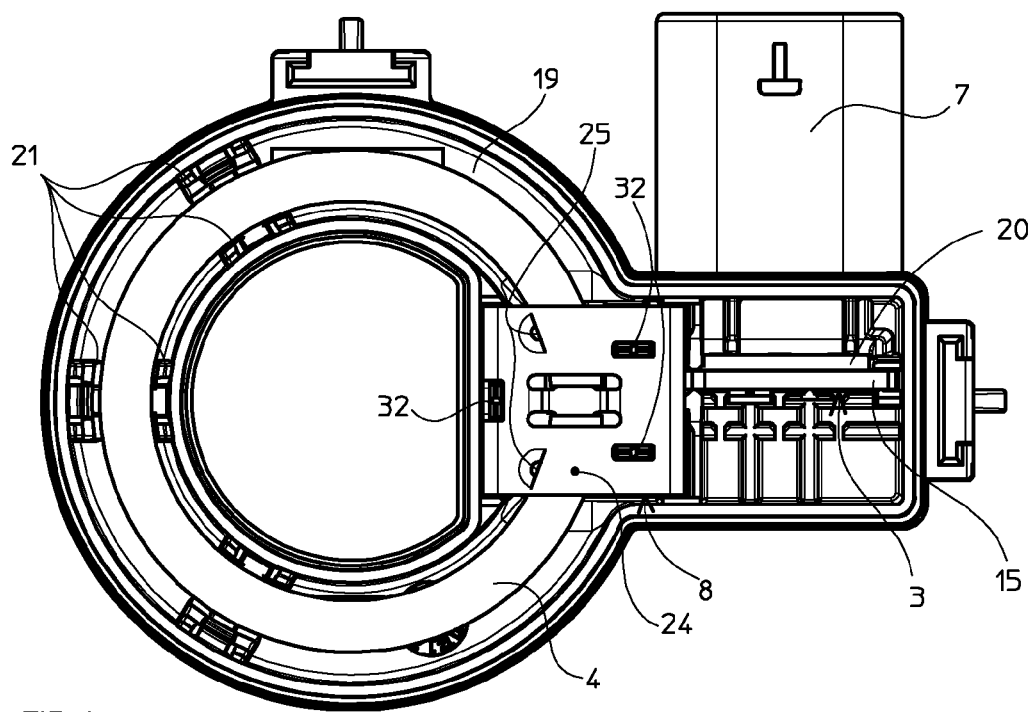
FIG. 4a is a view of the electrical current transducer of FIG. 1 without housing cover part, showing the magnetic circuit and magnetic field detector assembled in a housing base part.
Figure 4B:
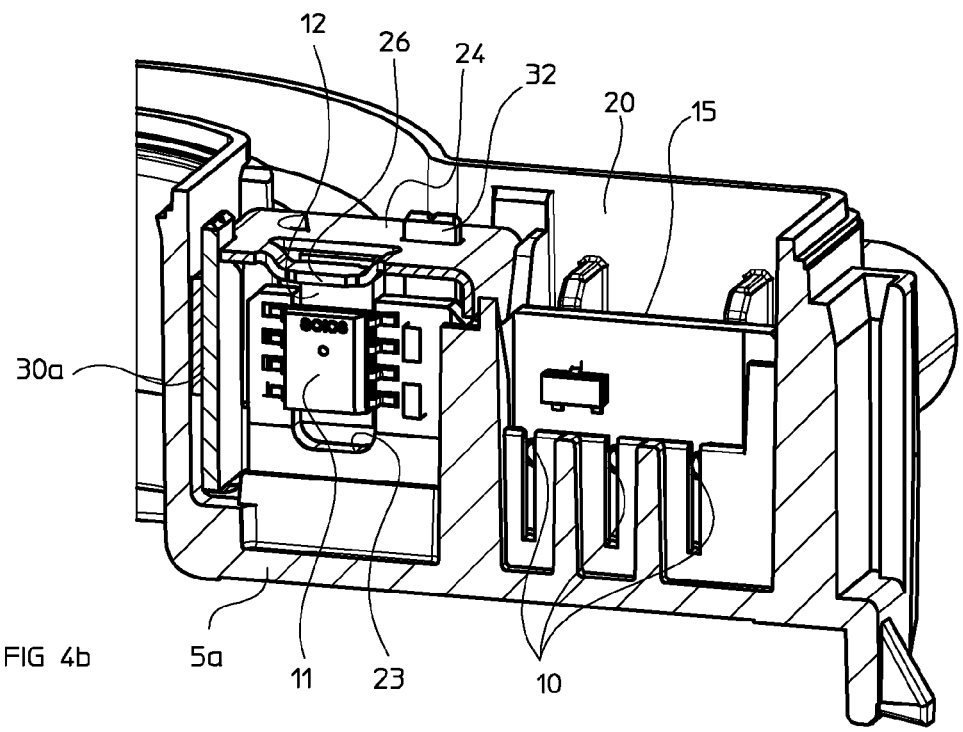
FIG. 4b is a detail perspective view of part of the assembly of FIG. 4a showing the magnetic field detector.
Figure 5:
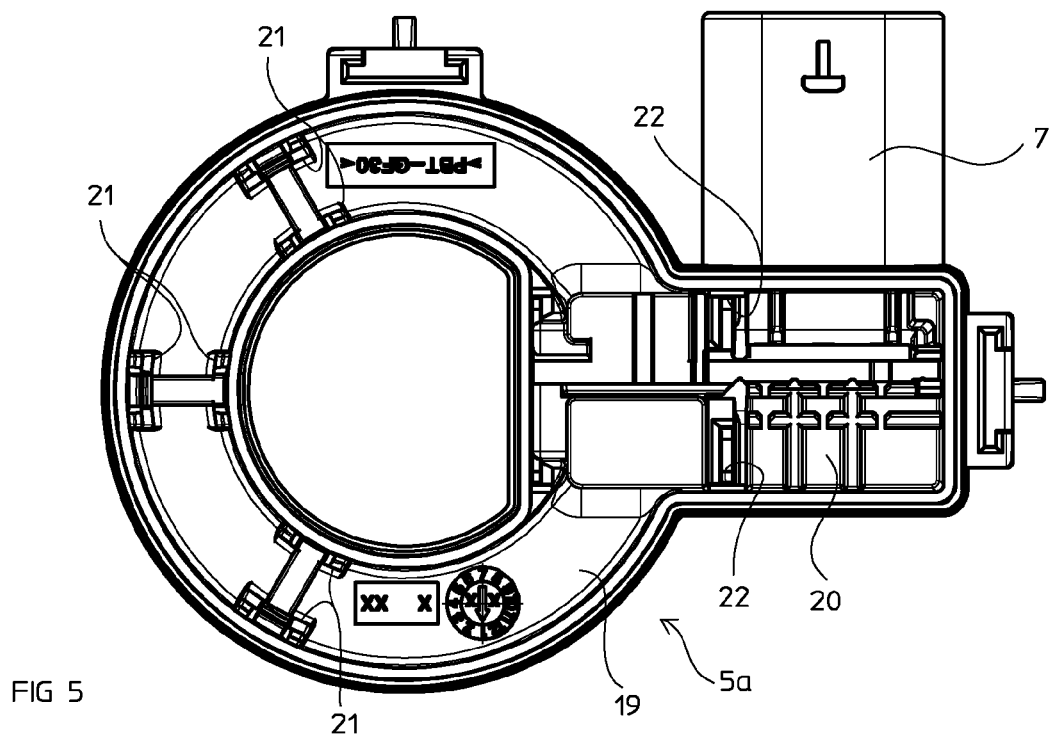

Referring to the figures, an electrical current transducer 1 comprises a magnetic circuit, a magnetic field detector 3, and a housing 5, the magnetic circuit and magnetic field detector being mounted in the housing. The housing comprises a base part 5a and a cover part (not shown) that closes the open end of the base part once the magnetic circuit and field detector are mounted in the housing base part.

The magnetic circuit comprises an annular magnetic core 4 with a gap 6 (also commonly known as an "air-gap" even though it may not be filled with air) and a bridging device 8 attached to the magnetic core either side of the gap. The gap 6 is formed between opposed end faces 12 of the magnetic core. In a preferred embodiment the magnetic core 4 is made of a wound strip of thin sheet material with a high magnetic permeability so as to form stacked concentric ring layers, from a radially innermost layer 16 to a radially outermost ring layer 18. Magnetic materials with high magnetic permeability are known and for instance include FeSi or FeNi alloys. The thin edges of the strip layer define opposed lateral sides 14a, 14b of the magnetic core. The lateral sides 14a, 14b are in planes that are orthogonal to an axial direction A that extends through the central passage of the current transducer, the central passage being configured for receiving one or more primary conductors carrying the electrical current or currents to be measured.

The magnetic material strip from which the core is wound has a width W that is preferably of the same order of magnitude as the radial distance R between the innermost and outermost layers 16, 18. The ratio of width to radial thickness W/R is preferably in the range of 0.3 to 3, more preferably in the range of 0.5 to 2.

The bridging device is made of a non-magnetic material. The bridging device may advantageously be made of an electrically conducting material and also serve to provide an electrical grounding connection between the magnetic core and a ground connection on the magnetic field detector or directly to an electrical ground terminal of the connector 7.

Referring to the figures, the bridging device 8 comprises a first part 8a and at least a second part 8b, the first and second parts being configured to be clamped around a portion of the magnetic core 4 comprising the gap 6. The bridging device 8 spans across the gap and is clamped on magnetic core portions both sides of the gap, against the opposed lateral surfaces 14a, 14b of the magnetic core. The bridging element 8 advantageously comprises a gap-width setting portion 26 inserted within the gap from one of the lateral sides 14a of the magnetic core and spanning between end faces 12 of the magnetic core. The gap-width setting portion is configured to adjust the width of the gap 6 and in particular to set the minimum width of the gap. The gap-width setting portion 26 may advantageously extend from the radially innermost layer 16 to be radially outer layer 18 to ensure that the ring layers do not shift relative to each other, and to ensure a constant gap width from the radially inner side to the radially outer side. The gap-width setting portion 26 may advantageously be in a form of an essentially planar portion of non magnetic sheet material that is positioned essentially flush with the lateral outer side 14a of the magnetic core thus consuming very little of the cross sectional surface area of the gap.

The bridging device 8 may further advantageously comprise housing fixing portions 28 for instance in the form of tabs or pins with barbs 29 that are inserted into corresponding cavities or interfere with corresponding wall portions 22 formed in the housing base part 5a. This allows fixing the magnetic circuit formed of the assembled magnetic core and bridging device securely within the housing base part during assembly. The housing base part comprises a magnetic core receiving cavity portion 19 with positioning elements such as positioning ribs or protrusions 21 to receive and position the magnetic core within the cavity portion 19 in conjunction with the housing fixing portions 28 of the bridging device 8 that lock the magnetic circuit assembly in the housing.

The first part 8a of the bridging device comprises a base portion 24 from which the gap-width setting portion 26 extends. The base portion may be essentially planar, configured for lying against the lateral surface 14a of the magnetic core. The first part 8a may advantageously be formed from a non-magnetic metal sheet material that is formed by a die stamping and forming process. The stamped and formed first part 8a may advantageously form a single integral part comprising the gap-width setting portion 26 and housing fixing portions 28 integrally connected to the base portion 24. The gap-width setting portion 26 may in particular be stamped out of the base portion 24 and remain integrally connected at ends to the base portion. Radial positioning protrusions 25 may be further stamped out of the base portion and are configured to position the base portion in the radial direction with respect to the magnetic core. The positioning protrusions 25 engage the radially innermost layer 16 of the magnetic core whereas the tangential position of the bridging device relative to the core is determined by the gap-width setting portion 26 set in the gap 6. The first part 8a may further comprise orifices 27 formed in the base portion 24 to receive therethrough free ends 32 of fixing extensions 30 of the second part 8b, to clamp together the first and second parts 8a, 8b.

The second part 8b comprises base portion extensions 31 from which the fixing extensions 30 extend whereby there are at least three fixing extensions, at least one radially inner fixing extension 30a and at least two radially outer fixing extensions 30b. The radially outer fixing extensions are positioned against the outermost ring layer 18 of the annular core on either side of the air gap, the space between the radially outer fixing extensions enabling insertion of the magnetic field detector in the gap 6. A pair of fixing extensions may be provided on the radially inner side however a single fixing extension is also possible as shown in the illustrated embodiment. The radially inner clamp fixing extension may be positioned opposite (in line with) the air gap 6.

The first and second parts 8a, 8b are assembled against opposing outer lateral sides 14a, 14b of the magnetic core whereby the free ends 32 of the second part fixing extensions are inserted through the corresponding orifices 27 of the first part. The free ends 32 are permanently deformed by a crimping operation configured to draw the two parts tightly towards each other to effect a stable and rigid clamping of the bridging device against the lateral sides of the magnetic core. The clamping effect also ensures that the ring layers of the magnetic core do not shift laterally with respect to each other and form planar lateral surfaces 14a, 14b. The clamping effect also ensures a good electrical connection between the magnetic core and bridging device, whereby the bridging element is electrically connected to the magnetic field detector device, in particular to conductive circuit traces on the circuit board after the magnetic field device.

The magnetic field detector device comprises a magnetic field sensor 11, for instance in the form of a Hall effect sensor, and a signal processing circuit 13 comprising a circuit board 15 on which the magnetic field sensor is mounted. The circuit board 15 of the magnetic field detector may advantageously comprise a U-shaped cutout 23 with the open end of the "U" oriented towards the upper lateral face 14a of the magnetic core such that an end 12 of the magnetic core may be inserted in the U-shaped cut out. This enables the gap width to be reduced such that the end faces 12 of the magnetic core are positioned either side of the magnetic field sensor 11 without the additional thickness of the circuit board. The contact pads of the magnetic field sensor are connected to the circuit board along the opposite parallel edges of the U-shaped cut out. The housing base part 5a comprises a magnetic field detector device receiving portion 20 that receives the magnetic field detector device 3 and may comprise various guide and positioning ribs or wall portions to orient and position the circuit board within the housing cavity portion. The electrical transducer may advantageously further comprise an integrally formed connector 7 for external connection. The connector comprises terminals that may for instance be in the form of pin terminals that are inserted through the connector housing portion and into terminal portions 10 of the circuit board that may for instance be in the form of plated through-holes.

The manufacturing process of the coil described herein includes an operation of winding a strip (band) of high magnetic permeability material, by conventional means for producing wound magnetic cores, and holding the ends of the strip with a spot weld, or alternatively an adhesive. The gap 6 is machined through a section of the stacked layers of the magnetic core. Subsequently, the bridging device parts 8a, 8b are mounted around the magnetic core such that the gap width gap-width setting portion 26 is inserted in gap and the fixing extensions 30 of the second part 8b are inserted through the corresponding cavities 27 of the first part 8a. The ends 32 of the fixing extensions 30 are then permanently deformed in a crimping operation by a Y shaped anvil such that the two parts 8a, 8b clamped together tightly against opposite lateral sides 14a, 14b of the wound magnetic core.

After the assembly of the bridging device, the magnetic circuit may pass through a heat treatment process for annealing the magnetic material of the core in order to provide it with uniform magnetic properties, in particular uniform high magnetic permeability. This removes or reduces the adverse effects on magnetic properties of the strip material resulting from the preceding manufacturing operations. The heat treatment process also has the advantageous effect of reducing internal stresses in the magnetic core material.

LIST OF REFERENCES electrical current transducer 1 magnetic circuit annular magnetic core 4 end faces 12 radially innermost layer 16 radially outermost layer 18 lateral sides 14a, 14b gap 6 bridging device 8 first part (gap setting part) 8a base portion 24 radial positioning protrusions 25 (inner) clamp extension receiving cavities 27 gap-width setting portion 26 housing fixing portions (tabs) 28 barbs 29 second part (clamp fixing part) 8b base portion extensions 31 clamp fixing extensions 30 radially inner 30a, radially outer 30b free end 32 (crimped) magnetic field detector device 3 magnetic field sensor 11 (e.g. Hall sensor) signal processing circuit 13 circuit board 15 U shaped cutout 23 conductive circuit traces terminal portions 10 housing 5 base part 5a magnetic circuit receiving cavity portion 19 positioning elements (ribs/protrusions) 21 fixing sides/cavities 22 magnetic field detector device receiving portion 20 cover part (not shown) connector 7 central passage 9 (for primary conductor).

The invention claimed is:

1. An electrical current transducer including a housing, a magnetic field detector device comprising a magnetic field sensing element, and a magnetic circuit comprising a magnetic core with a gap and a bridging device mounted on the magnetic core and spanning across the gap, the magnetic field sensing element being positioned in the gap, the bridging device comprising a gap-width setting portion made of a non-magnetic material inserted in the gap configured to determine a minimum width of the gap, wherein the bridging device comprises at least two parts, a first part mounted against a first lateral side of the magnetic core and a second part mounted against a second lateral side of the magnetic core opposite the first lateral side, at least one of the first and second parts comprising fixing extensions cooperating with the other of the first and second parts configured for clamping together the first and second parts around a portion of the magnetic core comprising the gap.

2. The electrical current transducer according to claim 1, wherein the magnetic core comprises a plurality of stacked concentric ring layers of magnetic material.

3. The electrical current transducer according to claim 1, wherein the bridging device is adapted to provide an electrical grounding connection for the magnetic core.

4. The electrical current transducer according to claim 1, wherein the gap-width setting portion of the bridging device is inserted within the gap from one of the lateral sides of the magnetic core and spanning between end faces of the magnetic core.

5. The electrical current transducer according to claim 4, wherein the gap-width setting portion extends from a radially innermost layer to a radially outermost layer of the magnetic core.

6. The electrical current transducer according to claim 1, wherein the gap-width setting portion is in a form of an essentially planar portion of non magnetic sheet material positioned essentially flush with the lateral outer side of the magnetic core.

7. The electrical current transducer according to claim 1, wherein the bridging device further comprises housing fixing portions in the form of tabs or pins interfering with corresponding wall portions formed in a housing base part of the housing configured to lock the magnetic circuit securely within the housing base part during assembly.

8. The electrical current transducer according to claim 1, wherein the first part of the bridging device comprises a base portion from which the gap-width setting portion extends, the base portion being essentially planar, configured for lying against the first lateral side of the magnetic core.

9. The electrical current transducer according to claim 1, wherein the bridging device first part is a single piece non-magnetic die stamped metal sheet part.

10. The electrical current transducer according to claim 1, wherein the bridging device second part is a single piece non-magnetic die stamped metal sheet part.

11. The electrical current transducer according to claim 1, wherein the bridging device first part comprises orifices in the base portion receiving therethrough free ends of fixing extensions of the second part, the free ends being crimped.

12. The electrical current transducer according to claim 1, wherein there are at least three fixing extensions, at least one radially inner fixing extension and at least two radially outer fixing extensions positioned against an outermost ring layer of the annular core on either side of the air gap.

13. The electrical current transducer according to claim 12, wherein the space between the radially outer fixing extensions is configured to enable insertion of the magnetic field detector in the gap.

14. A method of making a magnetic circuit of an electrical current transducer, including the steps of:
    winding a magnetically permeable strip material to form a multilayer wound magnetic core;
    machining a gap through a section of the wound magnetic core; providing first and second bridging device parts, at least one of which comprises a gap-width setting portion;
    mounting first and second bridging device parts around the magnetic core such that the gap-width setting portion is inserted in said gap and fixing extensions of the second bridging device part are inserted through corresponding cavities of the first bridging device part;
    crimping ends of the fixing extensions such that the first and second bridging device parts are clamped together tightly against opposite lateral sides of the wound magnetic core.

15. The method of making a magnetic circuit according to claim 14, wherein after the assembly of the first and second bridging device parts, the magnetic circuit is heat treated for annealing the magnetic material of the wound magnetic core.

* * * * *